US010886938B2

(12) United States Patent
Nezamfar et al.

(10) Patent No.: US 10,886,938 B2
(45) Date of Patent: Jan. 5, 2021

(54) ACTIVE ANALOG FRONT-END

(71) Applicant: Atmosic Technologies Inc., Campbell, CA (US)

(72) Inventors: Bita Nezamfar, Sunnyvale, CA (US); Justin Ann-Ping Hwang, Sunnyvale, CA (US); David Kuochieh Su, Saratoga, CA (US)

(73) Assignee: Atmosic Technologies Inc., Campbell, CA (US)

( * ) Notice: Subject to any disclaimer, the term of this patent is extended or adjusted under 35 U.S.C. 154(b) by 0 days.

(21) Appl. No.: 16/539,970

(22) Filed: Aug. 13, 2019

(65) Prior Publication Data

US 2020/0076449 A1 Mar. 5, 2020

Related U.S. Application Data

(60) Provisional application No. 62/727,481, filed on Sep. 5, 2018.

(51) Int. Cl.
*H03M 3/00* (2006.01)
*H04B 1/40* (2015.01)

(52) U.S. Cl.
CPC ............. *H03M 3/464* (2013.01); *H04B 1/40* (2013.01)

(58) Field of Classification Search
CPC ........ H03M 3/464; H03M 3/494; H03M 3/02; H04B 1/40
USPC .................................................. 341/143, 155
See application file for complete search history.

(56) References Cited

U.S. PATENT DOCUMENTS

| | | | | |
|---|---|---|---|---|
| 9,696,351 B2* | 7/2017 | Kumar | ............... | G01R 19/2503 |
| 10,012,679 B2* | 7/2018 | Eken | ....................... | H04B 17/00 |
| 10,270,545 B2* | 4/2019 | Park | ..................... | H04B 1/1027 |
| 10,469,031 B2* | 11/2019 | Anegawa | ............... | G01R 19/04 |
| 10,627,430 B2* | 4/2020 | Mukherjee | ........... | H03D 1/2272 |

* cited by examiner

*Primary Examiner* — Brian K Young
(74) *Attorney, Agent, or Firm* — Paradice & Li LLP

(57) ABSTRACT

This disclosure provides an active envelope detector to generate an output voltage based on an input radio-frequency (RF) signal. The active envelope detector includes a plurality of transistors configured to operate in a sub-threshold mode and generate an output voltage based on the input RF signal. A delta-modulation analog-to-digital converter (ADC) and a sigma-delta modulation ADC are provided. Both ADCs include an implementation of the active envelope detector to receive input RF signals.

19 Claims, 4 Drawing Sheets

ACTIVE ANALOG FRONT-END

CROSS-REFERENCE TO RELATED APPLICATION

This application claims the benefit of and commonly owned U.S. Provisional Patent Application No. 62/727,481 entitled "ACTIVE ANALOG FRONT-END WAKE-UP RECEIVER WITH DELTA MODULATION" filed on Sep. 5, 2018, the entirety of which is hereby incorporated by reference.

TECHNICAL FIELD

The present implementations relate generally to wireless devices, and more specifically to an active analog front-end for wireless devices.

BACKGROUND OF RELATED ART

Wireless devices (such as Wi-Fi devices, Bluetooth devices, wireless sensors, IoT devices and the like) may be battery powered to provide mobility and convenience. Some low-power wireless devices may use a passive radio-frequency (RF) analog front-end to receive communication signals, however passive RF analog front-ends may have poor sensitivity to incoming RF signals.

Thus, there is a need to improve the sensitivity of such analog front-ends for use with low-power wireless devices.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter described herein may be implemented as a delta-modulation analog-to-digital converter (ADC). The delta-modulation ADC may include an active envelope detector that may include a first transistor, a variable current source, and a second transistor. The first transistor may be configured to operate in a sub-threshold mode and generate a reference voltage. The variable current source may be configured to generate an output current. The second transistor may be configured to operate in the sub-threshold mode and provide an output voltage exponentially based on a radio-frequency input signal and the output current. The delta-modulation ADC may also include a comparator, an integrator, and a digital-to-analog converter (DAC). The comparator may be configured to generate a result signal based on a comparison between the reference voltage and the output voltage from the second transistor. The integrator may be configured to generate an integrator output signal based on the result signal. The DAC may be coupled to the integrator and configured to vary the output current of the variable current source based on the integrator output signal.

Another aspect of the subject matter of this disclosure may be implemented as a sigma-delta modulation analog-to-digital converter (ADC) comprising an active envelope detector, and analog integrator, a comparator and a digital low-pass filter. The active envelope detector may include a first transistor, a variable current source, and a second transistor. The first transistor may be configured to operate in a sub-threshold mode and generate a first reference voltage. The variable current source may be configured to generate an output current. The second transistor may be configured to operate in the sub-threshold mode and generate an output voltage exponentially based on a radio-frequency (RF) input signal. The analog integrator may be configured to generate an error signal based on a difference between the first reference voltage and the output voltage. The comparator may be configured to generate a comparator output signal based on the error signal and a second reference signal. The digital low-pass filter may be configured to filter the result signal and generate an output signal of the sigma-delta ADC.

Another innovative aspect of the subject matter described in this disclosure may be implemented as an active envelope detector to detect a radio-frequency (RF) input signal. The active envelope detector may include a first transistor configured to operate in a sub-threshold mode and generate a reference voltage, a variable current source configured to generate an output current, and a second transistor configured to operate in the sub-threshold mode and generate an output voltage exponentially based on an RF input signal.

BRIEF DESCRIPTION OF THE DRAWINGS

Aspects of the present disclosure are illustrated by way of example and are not intended to be limited by the figures of the accompanying drawings. Like numbers reference like elements throughout the drawings and specification.

DETAILED DESCRIPTION

Figure 1:
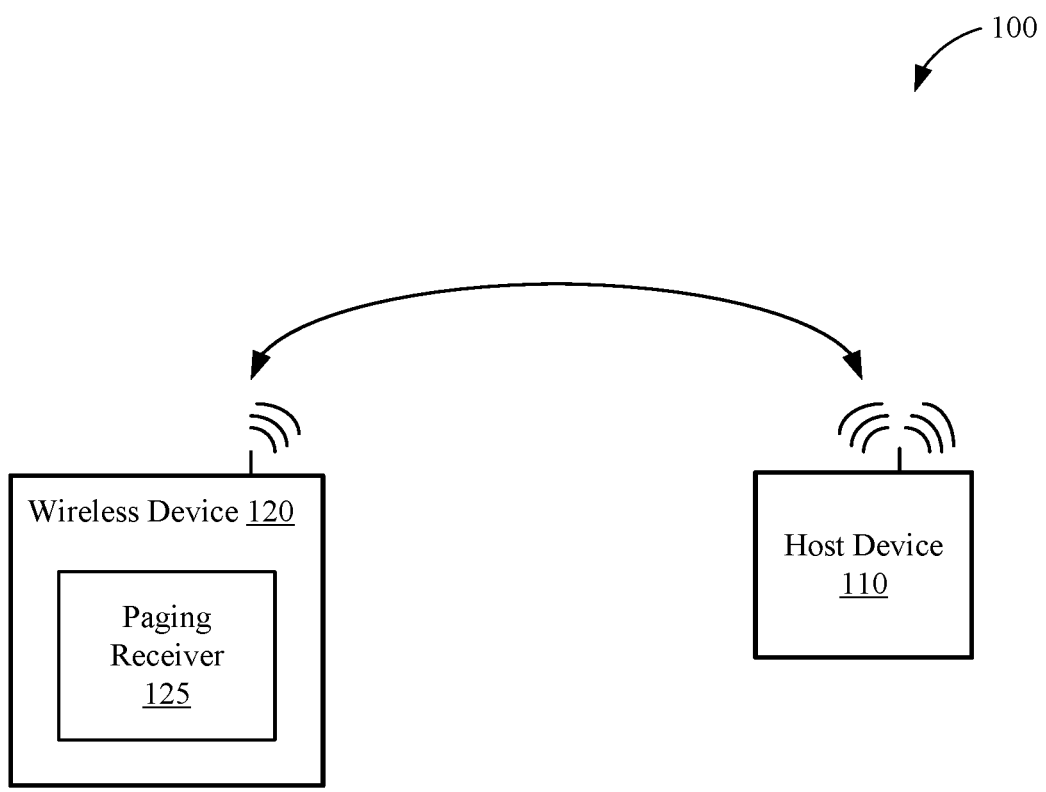
FIG. 1 depicts a wireless communication system within which aspects of the present disclosure may be implemented.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, system or network that is capable of transmitting and receiving RF signals according to any of the IEEE 16.11 standards, or any of the IEEE 802.11 standards, the Bluetooth® standard, code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless, cellular or internet of things (IOT) network, such as a system utilizing 3G, 4G or 5G, or further implementations thereof, technology.

In the following description, numerous specific details are set forth such as examples of specific components, circuits, and processes to provide a thorough understanding of the disclosure. The term "coupled" as used herein means coupled directly to or coupled through one or more intervening components or circuits. Also, in the following description and for purposes of explanation, specific nomenclature is set forth to provide a thorough understanding of the example implementations. However, it will be apparent to one skilled in the art that these specific details may not be required to practice the example implementations. In other instances, well-known circuits and devices are shown in block diagram form to avoid obscuring the disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory computer-readable storage medium comprising instructions that, when executed, performs one or more of the methods described below. The non-transitory computer-readable storage medium may form part of a computer program product, which may include packaging materials.

The non-transitory computer-readable storage medium may include random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a computer-readable communication medium that carries or communicates code in the form of instructions or data structures and that may be accessed, read, and/or executed by a computer or other processor.

The various illustrative logical blocks, modules, circuits and instructions described in connection with the implementations disclosed herein may be executed by one or more processors, such as one or more digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general-purpose processor may be a microprocessor, but in the alternative, the processor may be any conventional processor, controller, microcontroller, or state machine. A processor may also be implemented as a combination of computing devices (such as a combination of a DSP and a microprocessor), a plurality of microprocessors, one or more microprocessors in conjunction with a DSP core, or any other suitable configuration.

FIG. 1 depicts a wireless communication system 100 within which aspects of the present disclosure may be implemented. The wireless communication system 100 may include one or more wireless communication devices such as a host device 110 and a wireless device 120. The host device 110 and the wireless device 120 may be any suitable wireless communication device. Example wireless communication devices may include a cell phone, personal digital assistant (PDA), tablet device, laptop computer, IoT device, or the like. The host device 110 and the wireless device 120 may also be referred to as a user equipment (UE), a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

For ease of explanation and clarity, the wireless communication system 100 depicts a single host device 110 and a single wireless device 120. In other implementations, the wireless communication system 100 may include any technically feasible number of host devices and/or wireless devices. The host device 110 and the wireless device 120 may communicate with each other via one or more technically feasible wireless communication protocols. For example, the host device 110 and the wireless device 120 may communicate via Wi-Fi, Bluetooth®, Bluetooth Low Energy (BLE), LTE, or any other suitable communication protocol.

In some implementations, the host device 110 may transmit a paging signal to wake-up the wireless device 120. The paging signal, which may be a radio-frequency (RF) signal, may be received by a paging receiver 125 provided within the wireless device 120. In some implementations, the paging signal may be part of a low-power communication protocol enabling the host device 110 to communicate with one or more wireless devices, such as the wireless device 120. In response to receiving the paging signal, the paging receiver 125 may cause the wireless device 120 to communicate with other wireless devices, and/or to perform a number of user-selected operations. In some implementations, the paging receiver 125 may determine whether the received paging signal identifies or addresses wireless device 120, and may selectively perform one or more operations based on the determining. In some aspects, the paging receiver 125 may cause the wireless device 120 to wake-up, to power-up one or more components, and/or to perform any number of suitable operations if the received paging signal identifies or addresses the wireless device 120. In addition, or in the alternative, the paging receiver 125 may take no action if the received paging signal does not identify or address the wireless device 120.

The paging receiver 125 may include an active envelope detector (not shown for simplicity) that may process paging signals from the host device 110. In some implementations, the active envelope detector may detect a RF signal envelope, associated with the paging signal, that includes an on-off keying (OOK) modulated transmission that identifies or addresses the wireless device 120. In some aspects, the paging receiver 125 may operate in frequencies bands shared with other transceivers (not shown in FIG. 1 for simplicity) provided within the wireless device 120. In one implementation, the wireless device 120 may include one or more Wi-Fi and/or Bluetooth transceivers that operate within the within a 6 MHz, a 13 MHz, a 27 MHz, a 40 MHz, a 400 MHz, a 900 MHz, a 2.4 GHz, a 5 GHz, a 6 GHz, and/or a 60 GHz frequency band. In another implementation, the wireless device 120 may include one or more cellular transceivers that operate within various frequency bands (some of which may overlap frequency bands used by the one or more Wi-Fi and/or Bluetooth transceivers). Thus, the paging receiver 125 may share a frequency band with other transceivers of the wireless device 120. In some implementations, the paging signal may not be associated with any commercially available communication protocol (such as Wi-Fi and Bluetooth communication protocols), but instead may be based on a signaling technique independent of such commercially available communication protocols.

Figure 2:
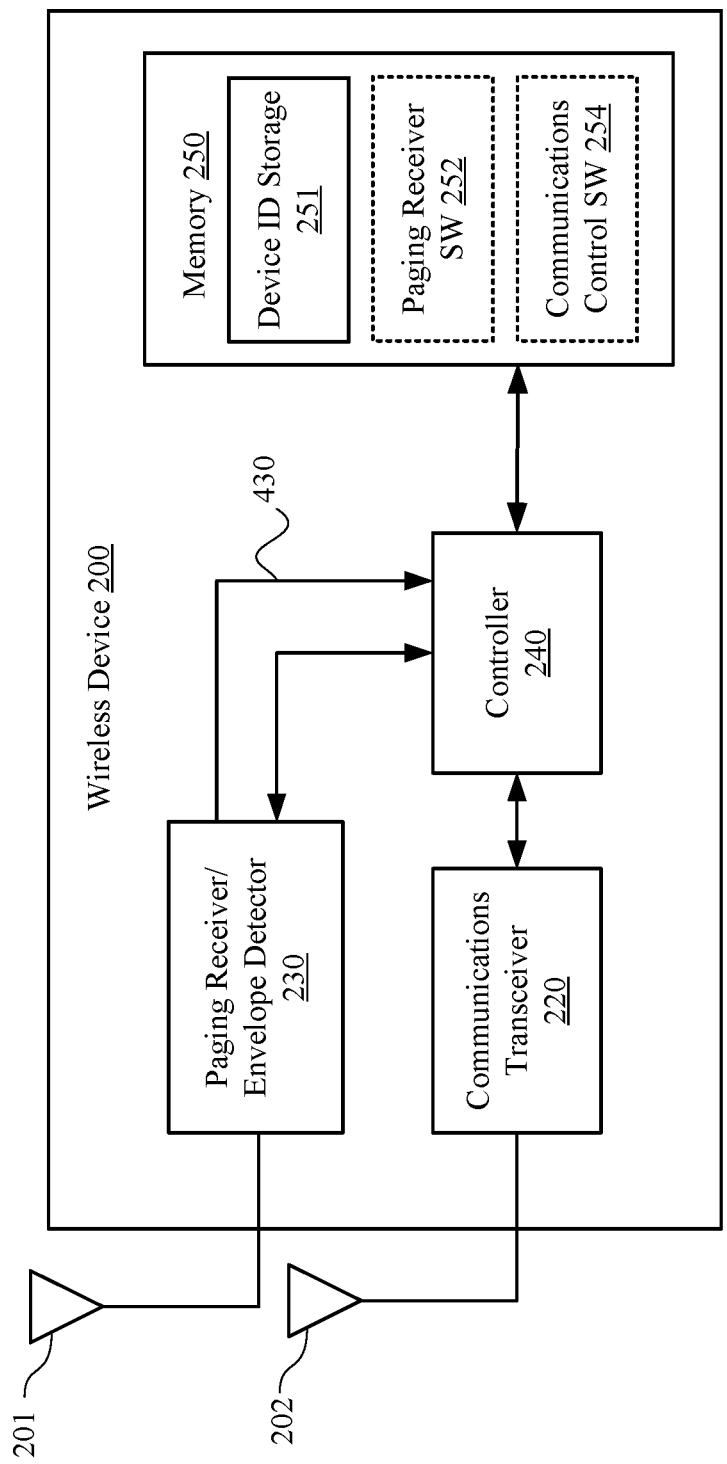
FIG. 2 depicts a block diagram of an example wireless device.

FIG. 2 depicts a block diagram of an example wireless device 200. The wireless device 200 may be an implementation of the wireless device 120 of FIG. 1. The wireless device 200 may include first and second antennas 201 and 202, a paging receiver/envelope detector 230, a communications transceiver 220, a controller 240, and a memory 250. In one implementation, the first antenna 201 may be coupled to the paging receiver/envelope detector 230, and the second antenna 202 may be coupled to the communications transceiver 220. In other implementations, the paging receiver/envelope detector 230 and the communications transceiver 220 may be coupled to the first and second antennas 201 and 202 through an antenna selection circuit (not shown for simplicity), for example, so that the paging receiver/envelope detector 230 and the communications transceiver 220 may share one or both of the first and second antennas 201 and 202. Although the example wireless device 200 is shown to include only two antennas 201 and 202, in other implementations, the example wireless device 200 may include any suitable number of antennas. Further, although FIG. 2 depicts the wireless device 200 as including only one communications transceiver 220, in other implementations, the wireless device 200 may include any number of communications transceivers. The paging receiver/envelope detector 230 may be an implementation of the paging receiver 125 of FIG. 1.

The communications transceiver 220 may be used to transmit signals to, and receive signals from, other suitable wireless devices. Although not shown in FIG. 2 for simplicity, the communications transceiver 220 may include any number of transmit chains to transmit signals to other wireless devices via the first and second antennas 201 and 202, and may include any number of receive chains to receive signals from the first and second antennas 201 and 202. The communications transceiver 220 may be coupled to the controller 240.

The paging receiver/envelope detector 230, which may be coupled to the controller 240, may receive paging signals transmitted from the host device 110. In some implementations, the paging signal may be transmitted using an on-off keying (OOK) modulation scheme, which uses the presence and absence of RF energy to encode data. In some aspects, the host device 110 may transmit an RF signal to indicate a first logical state (e.g., a logical one), and may not transmit the RF signal to indicate a second logical state (e.g., a logical zero). In other aspects, the host device 110 may transmit the RF signal to indicate the second logical state (e.g., a logical zero), and may not transmit the RF signal to indicate the first logical state (e.g., a logical one). In this manner, the paging receiver/envelope detector 230 may detect the presence and absence of an RF signal envelope in a paging signal to decode data embedded within (e.g., modulated on) the paging signal.

The paging signal may include an OOK modulated RF signal with a target identifier (ID) that identifies one or more wireless devices as intended recipients of the paging signal. Thus, the paging receiver/envelope detector 230 may examine the envelope of a received RF signal and determine if an associated target ID matches a device ID assigned to the wireless device 200. If the target ID matches the device ID of the wireless device 200, then the wireless device 200 may respond by performing an action, such as sending an acknowledgement message or any other feasible action.

The memory 250, which is coupled to at least the controller 240, may include a device ID storage 251 to store the device ID. As described above, the device ID may identify a specific wireless device (e.g., wireless device 200). The device ID may be a MAC address, an IP address, an assigned address, or any other number or value that may be associated with and/or used to identify or address the wireless device 200. The memory 250 may also include a non-transitory computer-readable storage medium (such as one or more nonvolatile memory elements, such as EPROM, EEPROM, Flash memory, a hard drive, etc.) that may store the following software (SW) modules:

- a paging receiver SW module 252 to control one or more operations of the paging receiver/envelope detector 230; and
- a communications control SW module 254 to control wireless transmission and reception operations of the communication transceiver 220.

In some implementations, one or more of the software modules 252 and 254 may be executed as a user application program. Each of the software modules 252 and 254 includes program instructions that, when executed by the controller 240, may cause the wireless device 200 to perform the corresponding function(s). Thus, the non-transitory computer-readable storage medium of memory 250 may include instructions for performing all or a portion of the operations described herein.

The controller 240, which may be coupled to the paging receiver/envelope detector 230, the communications transceiver 220, and the memory 250, may be any one or more suitable controllers or processors capable of executing scripts or instructions of one or more software programs stored in the wireless device 200 (e.g., within the memory 250). In some implementations, the controller 240 may be implemented with a hardware controller, a processor, a state machine or other circuits to provide the functionality of the controller 240 executing instructions stored in the memory 250. In other implementations, the controller 240 may be implemented as a multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein.

The controller 240 may execute the paging receiver SW module 252 to control, at least in part, one or more operations of the paging receiver/envelope detector 230. For example, execution of the paging receiver SW module 252 may enable the paging receiver/envelope detector 230 to receive an RF signal, examine an RF envelope associated with the RF signal, and determine whether the RF envelope includes an OOK modulated target ID that identifies or addresses the wireless device 200.

The controller 240 may execute the communications control SW module 254 to transmit and receive data via the communications transceiver 220 and one or both of the antennas 201 and 202. In some implementations, execution of the communications control SW module 254 may enable the wireless device 200 to transmit confirmation or acknowledgement messages, transmit BLE advertisement packets, and/or transmit and receive data to and from other wireless devices.

Figure 3:
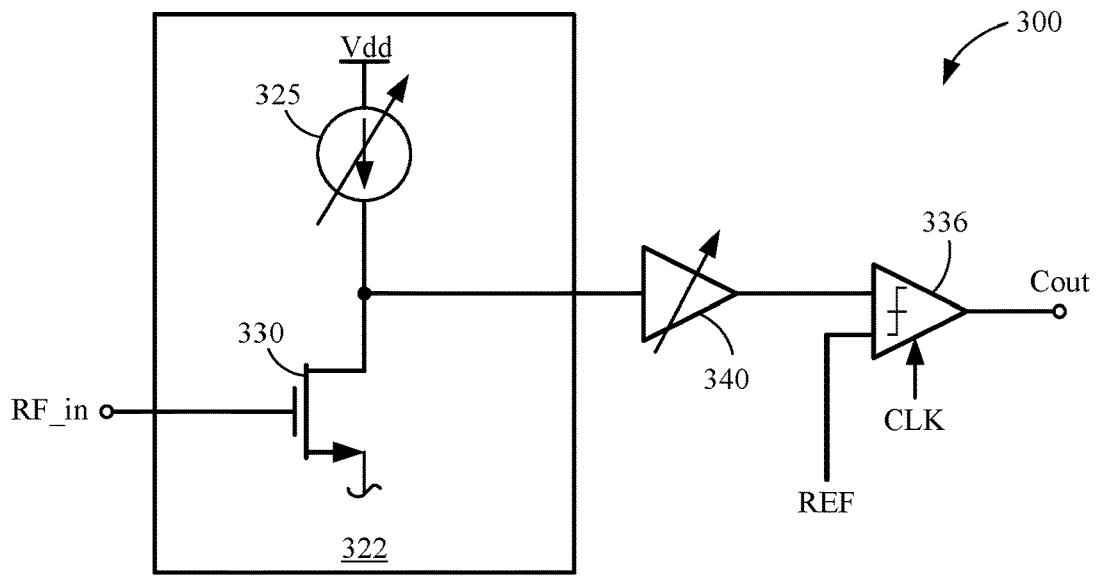
FIG. 3 is a simplified block diagram of an example analog front-end.

FIG. 3 is a simplified block diagram of an example analog front-end 300. The analog front-end 300 may be included in the paging receiver 125 of FIG. 1 and/or the paging receiver/envelope detector 230 of FIG. 2. The analog front-end 300 may be coupled to an antenna (not shown for simplicity) and may include an active envelope detector 322, an optional variable gain amplifier (VGA) 340, and a clocked comparator 336.

The active envelope detector 322 may include a transistor 330 and a variable current source 325 coupled in series between a supply voltage (Vdd) and ground potential. Although the transistor 330 is depicted as an n-channel field effect transistor (FET), persons skilled in the art will recognize that other transistors or semiconductors are feasible. For example, in other implementations, the transistor 330 may be a p-channel FET. The variable current source 325 may provide a bias current to the drain of the transistor 330. In some implementations, the variable current source 325 may provide a bias current of approximately 100 nano-amps (nA) plus or minus 25 nA. In other implementations, the variable current source 325 may provide different bias currents.

An RF input signal (shown as RF_in in FIG. 3) received from the antenna may be provided to a gate of the transistor 330. In some implementations, the bias current from the variable current source 325 and/or the RF input signal may cause the transistor 330 to operate in a "sub-threshold" mode. The sub-threshold mode may occur when the gate-to-source voltage of the transistor 330 is less than the threshold voltage of the transistor 330. When operating in the sub-threshold mode, the transistor 330 may provide an output current, via its drain terminal, that is exponentially related to the RF input signal (e.g., the voltage of the RF input signal). In some implementations, the transistor 330 may provide an output voltage (rather than an output current) that is exponentially related to the RF input signal.

The output of the active envelope detector 322 may be coupled to the clocked comparator 336 via the optional VGA 340. The clocked comparator 336 may compare the output of the VGA 340 (e.g., the output of the active envelope detector 322) to a reference signal (REF) to determine whether an RF signal or envelope is present or absent in the received RF input signal.

As described above, the wireless device 200 of FIG. 2 may receive an RF input signal that includes data encoded using OOK modulation. The OOK modulated RF input signals may be suitable for low-power receivers because of their relatively simple modulation/demodulation schemes and low effective data rates (e.g., as compared with other modulation schemes such as quadrature amplitude modulation (QAM) schemes). The output signal (Cout) provided by the clocked comparator 336 may be clocked by a clock signal (CLK) having a frequency of approximately 32 KHz (although other clock frequencies are may be used). In some implementations, the clock frequency of the local clock may be much greater (for example, at least ten times greater) than an effective bandwidth of the OOK modulated RF input signal received by the analog front-end 300 making the output signal Cout suitable for delta or sigma-delta modulation.

Figure 4:
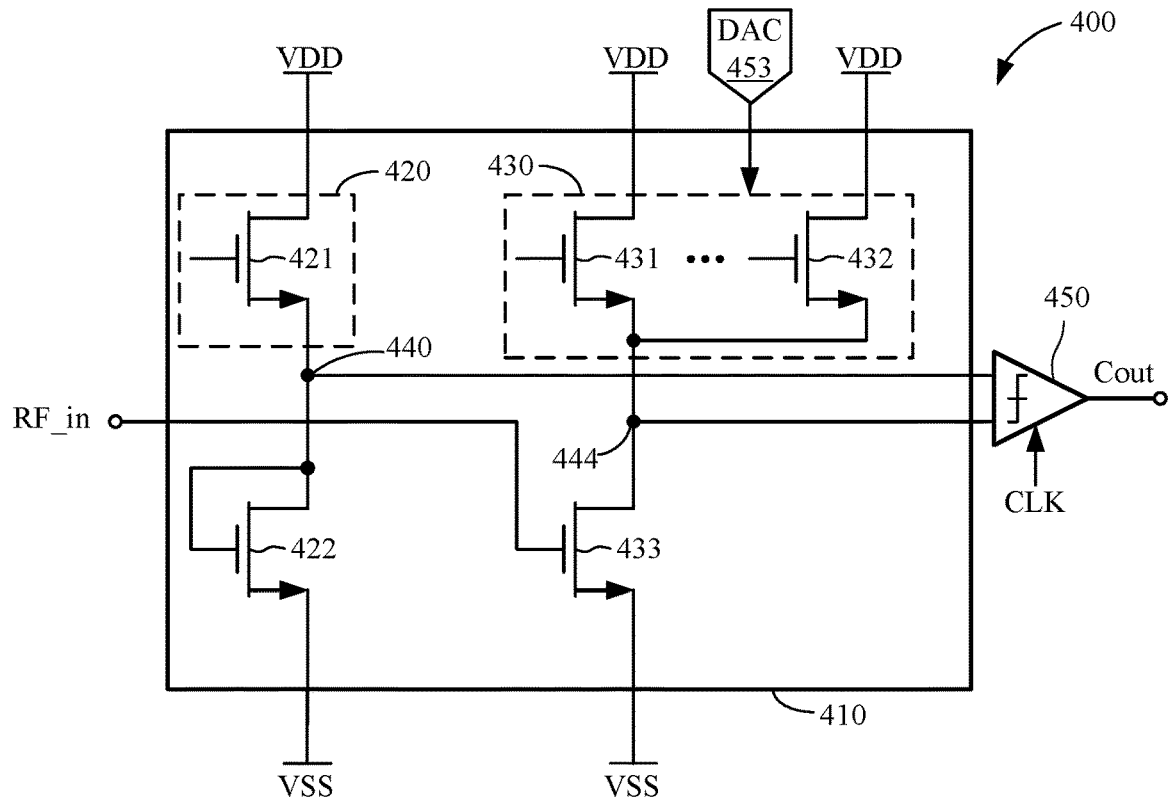
FIG. 4 is a simplified schematic diagram of an example analog front-end.

FIG. 4 is a schematic diagram of an example analog front-end 400. The analog front-end 400 may include an active envelope detector 410, which may be an implementation of the active envelope detector 322 of FIG. 3, and a clocked comparator 450. The clocked comparator 450 may be an implementation of the clocked comparator 336 of FIG. 3.

The active envelope detector 410 may include a first current source 420, a second current source 430, a first transistor 422, and a second transistor 433. The first current source 420 may include one or more transistors configured to provide a bias current for the first transistor 422. As shown, the first current source 420 includes a third transistor 421. In other implementations, the first current source 420 may include any number of transistors, resistors, capacitors, or the like. For example, the first current source 420 may include at least one additional transistor (not shown for simplicity) coupled in series with the third transistor 421 in a cascode configuration. The cascode configuration may increase the output impedance of the first current source 420. In some implementations, the third transistor 421 may be configured to operate as a fixed current source, and a fixed voltage may be provided to the gate of the third transistor 421 such that a fixed output current is provided to the first transistor 422.

In some implementations, the first transistor 422 may be configured to operate as a diode. For example, the first transistor 422 may be a diode-connected field effect transistor having its gate and drain coupled together. The bias current provided by the first current source 420, and the configuration of the first transistor 422, may cause the first transistor 422 to operate in the sub-threshold mode. In some aspects, a reference voltage may be provided at node 440 based at least in part on the bias current provided by the first current source 420 and the first transistor 422.

The second current source 430 may include a fourth transistor 431 and a fifth transistor 432. Although only two transistors are shown, in other implementations the second current source 430 may include any number of transistors, resistors, capacitors, or the like. In one implementation, the second current source 430 may include additional transistors coupled in series with the fourth transistor 431 and the fifth transistor 432 in a cascode configuration. The cascode configuration may increase the output impedance of the second current source 430. In another implementation, additional transistors may be used in parallel with the fourth transistor 431 and the fifth transistor 432.

In some implementations, the fourth transistor 431 may be configured to operate as a fixed current source. For example, a fixed voltage may be provided to a gate of the fourth transistor 431 such that a fixed output current is provided to the second transistor 433. In some implementations, the fifth transistor 432 may be configured to operate as a variable current source, and a digital-to-analog converter (DAC) 453 may be configured to provide a variable voltage to the second current source 430. An output voltage provided by the DAC 453 may adjust or vary the current in the second current source 430 to (in some cases) compensate and/or eliminate circuit mismatches and noise in the environment. For example, the DAC 453 may enable or control operation of one or more devices, branches or circuits within the second current source 430. In the example of FIG. 4, the DAC 453 is shown as being external to the active envelope detector 410. In other implementations, the DAC 453 may be included with the active envelope detector 410.

The fourth transistor 431 and the fifth transistor 432 which form the second current source 430 may be coupled together in parallel to provide a bias current for the second transistor 433. In some implementations, the second current source 430 may provide an output current of 100 nA plus or minus 25 nA. In addition, the active envelope detector 410 may be coupled to an antenna (not shown for simplicity) to receive an RF input signal (shown in FIG. 4 as RF_in). In some implementations, the RF input signal may be coupled to the gate of the second transistor 433. Together, the bias current provided by the second current source 430, and the RF input signal at the gate of the second transistor 433, may cause the second transistor 433 to operate in the sub-threshold mode.

When operating in the sub-threshold mode, the second transistor 433 may provide an output current that is exponentially related to the RF input signal (e.g., the voltage of the RF input signal) received at the gate of the second transistor 433. In some implementations, the second transistor 433 may provide an output voltage that is exponentially related to the RF input signal. Thus, the second transistor 433 may provide a signal (a voltage or a current) that is exponentially related to the RF input signal at node 444.

In some implementations, the active envelope detector 410 also may be coupled to the clocked comparator 450. A first input of the clocked comparator 450 may be coupled to the node 440, a second input of the clocked comparator 450 may be coupled to the node 444, and an output of the clocked comparator 450 may provide an output signal (Cout). In some aspects, the clocked comparator 450 may compare a reference voltage (at the node 440) to a voltage determined at least in part by the RF input signal (at the node 444). In some implementations, the clocked comparator 450 may determine the presence or absence of an envelope of an RF signal by comparing a signal corresponding to the input RF signal to a reference signal. As described above with respect to FIG. 3, in some implementations, the clocked comparator 450 may be clocked by a clock signal (CLK) having a frequency at least ten times greater than the bandwidth of an OOK modulated RF input signal.

Figure 5:
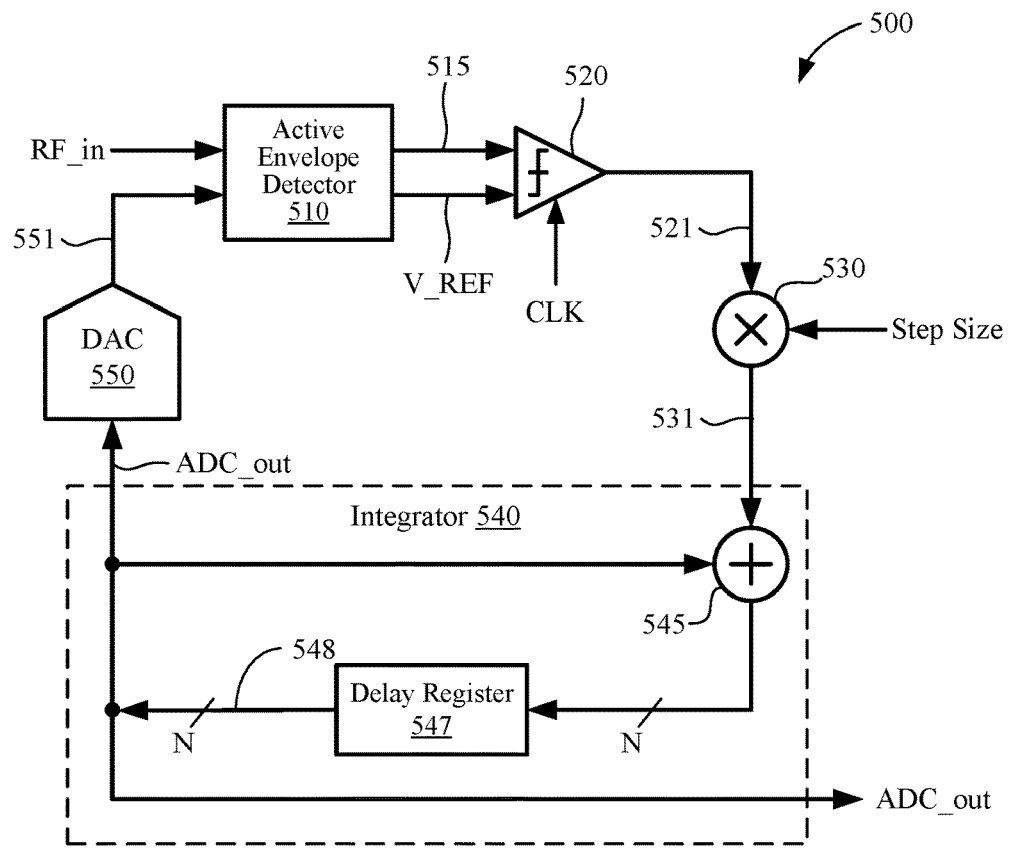
FIG. 5 is a block diagram of an example delta-modulation analog-to-digital converter.

FIG. 5 is a block diagram of an example delta-modulation ADC 500. The delta-modulation ADC 500 may include an active envelope detector 510, a clocked comparator 520, a multiplier 530, an integrator 540, and a DAC 550. The active envelope detector 510 may be an implementation of the active envelope detector 322 of FIG. 3 and/or the active envelope detector 410 of FIG. 4. Similarly, the clocked comparator 520 may be an implementation of the clocked comparator 336 of FIG. 3 and/or the clocked comparator 450 of FIG. 4 and the DAC 550 may be an implementation of the DAC 453 of FIG. 4.

In some implementations, the delta-modulation ADC 500 may provide an N-bit output signal (ADC_out) based on an RF input signal (RF_in), where N is a non-zero integer. The N-bit output signal ADC_out may indicate a magnitude of the RF input signal and, in some cases, may indicate an envelope size of the RF input signal. The envelope size of the RF input signal may be used to demodulate OOK encoded data such as, for example, an OOK modulated paging signal (as described above with respect to FIG. 1).

In some implementations, the RF input signal may be received and processed by the active envelope detector 510 to generate a envelope detector output signal 515 that has an exponential relationship to the RF input signal. In some aspects, the active envelope detector 510 may also generate a reference voltage (V_REF). The clocked comparator 520 may compare the envelope detector output signal 515 with the reference voltage (V_REF) to generate a single-bit comparison result signal 521. The multiplier 530 may scale the result signal 521 based on a step size to generate a scaled signal 531, which is provided to the integrator 540.

In some implementations, the integrator 540 may include an adder 545 and a delay register 547, and may be configured to integrate (such as average) the scaled signal 531 provided by the multiplier 530 to generate an N-bit output signal ADC_out. The adder 545 may receive the scaled signal 531 provided by the multiplier 530 and an N-bit delayed signal 548 output from the delay register 547. Together, the adder 545 and the delay register 547 may "average" the scaled signal 531 provided by the multiplier 530. In some implementations, the integrator 540 may average the current output signal provided by the comparator 520 and one or more previous output signals provided by the comparator 520 to generate the N-bit output signal ADC_out. In some aspects, the N-bit output signal ADC_out is provided to the DAC 550, which converts the N-bit output signal ADC_out into an analog signal 551 that is provided to a second input of the active envelope detector 510. By feeding the output signal ADC_out back to the active envelope detector 510 (via the DAC 550), the delta-modulation ADC 500 may determine whether a magnitude of the RF input signal is increasing or decreasing with respect to previous magnitudes of the RF input signal. In some implementations, the clocked comparator 520 and the integrator 540 may be clocked by a clock signal (CLK) having a frequency at least ten times greater than the bandwidth of an OOK modulated input signal.

Figure 6:
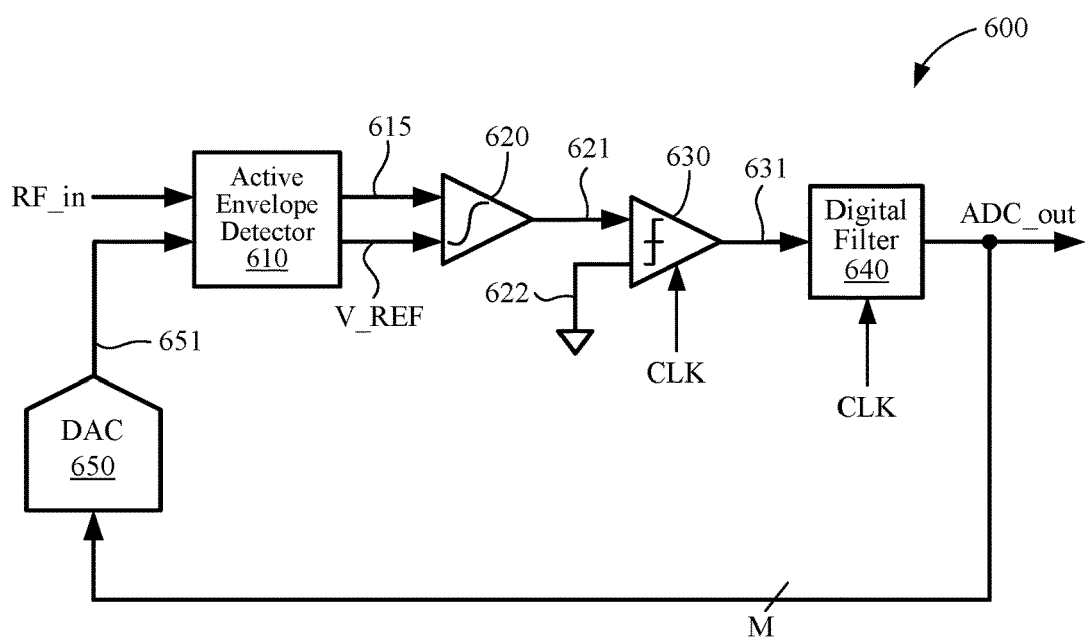
FIG. 6 is a block diagram of an example sigma-delta modulation analog-to-digital converter.

FIG. 6 is a block diagram of an example sigma-delta modulation ADC 600. The sigma-delta modulation ADC 600 may include an active envelope detector 610, an analog integrator 620, a comparator 630, a digital filter 640, and a DAC 650. The active envelope detector 610 may be an implementation of the active envelope detector 322 of FIG. 3 and/or the active envelope detector 410 of FIG. 4. Similarly, the DAC 550 may be an implementation of the DAC 453 of FIG. 4.

The sigma-delta modulation ADC 600 may generate an M-bit output signal (ADC_out) based on the RF input signal (RF_in). In some implementations, the processed RF input signal 615 may have an exponential relationship to the RF input signal. In some aspects, the active envelope detector 610 may also provide a reference voltage (V_REF) to the analog integrator 620.

In some implementations, the analog integrator 620 may be implemented either wholly or substantially with analog circuitry to integrate and/or average a difference between the processed RF input signal 615 and the reference voltage V_REF to generate an averaged error signal 621. The comparator 630 may compare the averaged error signal 621 to a reference signal 622 to generate a comparison result signal 631. Although the reference signal 622 is shown in the example of FIG. 6 as ground potential, any feasible reference voltage may be used as the reference signal 622. In some implementations, the comparator 630 may a clocked comparator similar to the clocked comparator 520 of FIG. 5.

The result signal 631 generated by the comparator 630 may be provided to the digital filter 640. The digital filter 640, which may be a multi-tap finite impulse response (FIR) filter, an infinite impulse response (IIR) filter, a low-pass filter, or any other feasible digital filter type, filters the result signal 631 to generate an M-bit digital output signal (AD- C_out). In some implementations, the digital filter 640 (and the comparator 630, if the comparator is clocked) may be clocked by a clock signal (CLK) having a frequency at least ten times greater than the bandwidth of an OOK modulated input signal.

The M-bit digital output signal (ADC_out) is provided as a feedback signal to the DAC 650, which converts the output signal ADC_out into an analog signal 651 that is provided to a second input of the active envelope detector 610. By feeding back the output signal ADC_out to the active envelope detector 610, the sigma-delta modulation ADC 600 may determine whether a magnitude of the RF input signal is increasing or decreasing with respect to previous magnitudes of the RF input signal.

In the foregoing specification, the example implementations have been described with reference to specific exemplary implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A delta-modulation analog-to-digital converter (ADC) comprising:
    an active envelope detector configured to receive a radio-frequency (RF) input signal, and comprising:
        a first transistor configured to operate in a sub-threshold mode and to generate a reference voltage;
        a variable current source configured to generate an output current; and
        a second transistor configured to operate in the sub-threshold mode and to generate an output voltage based on the RF input signal and the output current;
    a comparator configured to generate a result signal based on a comparison between the reference voltage and the output voltage;
    an integrator configured to generate an integrator output signal based the result signal; and
    a digital-to-analog converter (DAC) coupled to the integrator and configured to vary the output current of the variable current source based on the integrator output signal.

2. The delta-modulation ADC of claim 1, wherein the output voltage is exponentially related to the RF input signal.

3. The delta-modulation ADC of claim 1, wherein the variable current source comprises:
    a third transistor configured to vary the output current based on a voltage generated by the DAC.

4. The delta-modulation ADC of claim 3, wherein the variable current source further comprises:
    a fourth transistor configured to generate a fixed current, wherein the output current is based on a current of the third transistor and the fixed current generated by the fourth transistor.

5. The delta-modulation ADC of claim 1, further comprising:
    a multiplier configured to scale the result signal to generate a scaled result signal.

6. The delta-modulation ADC of claim 1, wherein the comparator is configured to compare the reference voltage and the output voltage from the second transistor in response to a clock signal.

7. The delta-modulation ADC of claim 6, wherein a frequency of the clock signal is at least ten times greater than a bandwidth of the RF input signal.

8. The delta-modulation ADC of claim 6, wherein the integrator is configured to generate an output signal of the delta-modulation ADC based on an average of a magnitude of a current result signal and magnitudes of one or more previous result signals.

9. The delta-modulation ADC of claim 1, wherein the first transistor is a diode-connected field effect transistor configured to generate the reference voltage.

10. A sigma-delta modulation analog-to-digital converter (ADC) comprising:
    an active envelope detector configured to receive a radio-frequency (RF) input signal, and comprising:
        a first transistor configured to operate in a sub-threshold mode and generate a first reference voltage;
        a variable current source configured to generate an output current; and
        a second transistor configured to operate in the sub-threshold mode and to generate an output voltage based on the RF input signal and the output current;
    an analog integrator configured to generate an error signal based on a difference between the first reference voltage and the output voltage;
    a comparator configured to generate a result signal based on the error signal and a second reference voltage; and
    a digital low-pass filter configured to filter the result signal and to generate an output signal of the sigma-delta modulation ADC.

11. The sigma-delta modulation ADC of claim 10, further comprising:
    a digital-to-analog converter (DAC) configured to generate a DAC voltage based on the output signal of the sigma-delta modulation ADC.

12. The sigma-delta modulation ADC of claim 11, wherein the variable current source comprises:
    a third transistor configured to vary the output current based on the DAC voltage.

13. The sigma-delta modulation ADC of claim 12, further comprising:
    a fourth transistor configured to generate a fixed current, wherein the output current of the variable current source is based on a current generated by the third transistor and the fixed current generated by the fourth transistor.

14. The sigma-delta modulation ADC of claim 10, wherein the first transistor is a diode-connected field effect transistor configured to generate the first reference voltage.

15. The sigma-delta modulation ADC of claim 10, wherein the comparator is configured to compare the error signal and the second reference voltage in response to a clock signal.

16. The sigma-delta modulation ADC of claim 15, wherein a frequency of the clock signal is at least ten times greater than a bandwidth of the RF input signal.

17. The sigma-delta modulation ADC of claim 10, wherein the output voltage is exponentially related to the RF input signal.

18. An active envelope detector to detect a radio-frequency (RF) input signal comprising:
    a first transistor configured to operate in a sub-threshold mode and to generate a reference voltage;
    a variable current source configured to generate an output current;
    a second transistor configured to operate in the sub-threshold mode and to generate an output voltage based on the RF input signal and the output current; and a clocked comparator configured to compare the reference voltage to the output voltage in response to a clock signal.

19. The active envelope detector of claim 18, wherein the variable current source comprises:
a third transistor configured to vary the output current based on a voltage received from a digital-to-analog converter (DAC).

\* \* \* \* \*